United States Patent
Ding et al.

(10) Patent No.: US 11,132,808 B2
(45) Date of Patent: Sep. 28, 2021

(54) OLED DISPLAY STRUCTURE AND DISPLAY DEVICE, SPATIAL POINT POSITIONING SYSTEM AND METHOD FOR POSITIONING SPATIAL POINT

(71) Applicant: BOE Technology Group Co., Ltd., Beijing (CN)

(72) Inventors: Xiaoliang Ding, Beijing (CN); Xue Dong, Beijing (CN); Haisheng Wang, Beijing (CN); Yingming Liu, Beijing (CN); Pengpeng Wang, Beijing (CN); Wei Liu, Beijing (CN); Huizhong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 16/138,870

(22) Filed: Sep. 21, 2018

(65) Prior Publication Data
US 2019/0102896 A1 Apr. 4, 2019

(30) Foreign Application Priority Data
Sep. 29, 2017 (CN) .......................... 201710909195.5

(51) Int. Cl.
*G06T 7/55* (2017.01)
*G09G 3/00* (2006.01)
*H01L 27/32* (2006.01)

(52) U.S. Cl.
CPC ................ *G06T 7/55* (2017.01); *G09G 3/00* (2013.01); *G06T 2207/10048* (2013.01); *H01L 27/3213* (2013.01); *H01L 27/3234* (2013.01)

(58) Field of Classification Search
CPC .......... G06F 3/042; C09K 11/06; G06T 7/55; G06T 2207/10048; G09G 3/00; H01L 27/3213; H01L 27/3234
See application file for complete search history.

(56) References Cited

U.S. PATENT DOCUMENTS

| | | | |
|---|---|---|---|
| 6,610,455 B1 * | 8/2003 | Burberry | H01L 51/0013 430/200 |
| 7,202,856 B2 | 4/2007 | Cok | |
| 7,385,710 B1 * | 6/2008 | Sturgill | G01B 11/06 356/632 |
| 8,692,198 B2 | 4/2014 | Jiang et al. | |
| 2004/0132228 A1 * | 7/2004 | Magno | C23C 14/28 438/99 |

(Continued)

FOREIGN PATENT DOCUMENTS

| | | |
|---|---|---|
| CN | 101887691 A | 11/2010 |
| CN | 102479799 A | 5/2012 |

(Continued)

OTHER PUBLICATIONS

Office Action issued in corresponding Chinese Patent Application No. 201710909195.5, dated Sep. 18, 2019.

*Primary Examiner* — Kenny A Cese
(74) *Attorney, Agent, or Firm* — McDermott Will & Emery LLP

(57) ABSTRACT

An OLED display structure, an OLED display device, and a spatial point positioning system and a method thereof are provided. The OLED display structure includes a light emitting layer which has a plurality of pixels, and infrared sub-pixels arranged between adjacent pixels.

14 Claims, 4 Drawing Sheets

(56) References Cited

U.S. PATENT DOCUMENTS

| | | | | |
|---|---|---|---|---|
| 2012/0006978 A1* | 1/2012 | Ludwig | ................ | G06F 3/0412 |
| | | | | 250/214.1 |
| 2016/0276629 A1* | 9/2016 | Ma | ...................... | H01L 51/5209 |
| 2017/0123542 A1* | 5/2017 | Xie | ...................... | G06F 3/0416 |
| 2017/0205886 A1 | 7/2017 | Wan et al. | | |
| 2017/0264882 A1* | 9/2017 | Helberg | ............... | H04N 5/2624 |

FOREIGN PATENT DOCUMENTS

| | | |
|---|---|---|
| CN | 102769025 A | 11/2012 |
| CN | 104009067 A | 8/2014 |

\* cited by examiner

OLED DISPLAY STRUCTURE AND DISPLAY DEVICE, SPATIAL POINT POSITIONING SYSTEM AND METHOD FOR POSITIONING SPATIAL POINT

CROSS-REFERENCE TO RELATED APPLICATION

This application claims priority benefit of Chinese Patent Application No. 201710909195.5 filed on Sep. 29, 2017 in China National Intellectual Property Administration, the disclosure of which is incorporated herein by reference in entirety.

TECHNICAL FIELD

The present disclosure generally relates to a field of display devices, and in particular, to an OLED display structure, an OLED display device, and a spatial point positioning system and a method for positioning a spatial point.

BACKGROUND

Currently, with a rapid development of three dimensional (3D) and Virtual Reality (VR) techniques, more and more demands are raised to the 3D spatial positioning technology. A spatial positioning technology in the related art is based on stereo-photography technology with dual camera. However, for example, when searching for corresponding character points in two images, the algorithm is very difficult and the program load is extremely large. Further, it is extremely prone to error, and for an object without texture characters in the space, it is impossible to acquire information of a depth of focus.

SUMMARY

According to an aspect of the present disclosure, there is provided an OLED display structure, comprising a light emitting layer, wherein: the light emitting layer comprises a plurality of pixels, and infrared sub-pixels arranged between adjacent pixels.

In an embodiment of the present disclosure, frequency of infrared lights emitted from the infrared sub-pixels changes with time so as to create set codes.

In an embodiment of the present disclosure, the OLED display structure further comprises an upper substrate layer, a cathode layer, the light emitting layer, an array substrate and a lower substrate layer arranged in sequence.

In an embodiment of the present disclosure, the OLED display structure further comprises a lens layer between the upper substrate layer and the cathode layer.

In an embodiment of the present disclosure, a lens structure is provided at a position in the lens layer corresponding to each of the infrared sub-pixels.

In an embodiment of the present disclosure, each of the pixels comprises a red sub-pixel, a green sub-pixel and a blue sub-pixel.

According another aspect of the present disclosure, there is provided an OLED display device comprising the OLED display structure.

According to another aspect of the present disclosure, there is provided a spatial point positioning system based on an OLED display device, comprising: the OLED display device for transmitting information of position character to a surface of an object with the infrared sub-pixels; at least two infrared cameras, each of which is configured to take photos of the surface of the object, so as to obtain projection images comprising the information of position character; and a processor for calculating information of a depth of focus at character points in accordance with the character points which are points having same information of position character in each of the projection images.

In an embodiment of the present disclosure, the OLED display device is also configured to mark the surface of the object in accordance with the infrared sub-pixels on the light emitting layer, the number of marking points is identical with the number of the infrared sub-pixels, and the infrared sub-pixels illuminate the surface of the object in accordance with set codes.

In an embodiment of the present disclosure, "the character points which are points having same information of position character in each of the projection images" is specified as: demodulating the projection images and comparing demodulated information on the projection images, if the demodulated information on the projection images are the same, the points having the same demodulated information on the projection images are the character points.

In an embodiment of the present disclosure, the set codes are codes which are formed by changing the frequency of the infrared lights illuminating the object with time.

In an embodiment of the present disclosure, the depth of focus of the character points is calculated by means of a triangular positioning method.

In an embodiment of the present disclosure, the at least two cameras are provided on the OLED display device.

According to another aspect of the present disclosure, there is provided a method for positioning a spatial point based on the OLED display device, including the following steps: transmitting information of position character to a surface of an object with the infrared sub-pixels on the OLED display device; obtaining projection images by taking photos of the surface of the object with at least two infrared cameras, wherein the projection image taken by each of the infrared cameras comprises the information of the position character; and acquiring the projection images and calculating information of a depth of focus at character points in accordance with the character points, wherein the character points are points having same information of position character in each of the projection images.

In an embodiment of the present disclosure, "transmitting information of position character to a surface of an object with the infrared sub-pixels on the OLED display device" comprises: marking the surface of the object in accordance with the infrared sub-pixels on the light emitting layer, the number of marking points being identical with the number of the infrared sub-pixels, the infrared sub-pixels illuminate the surface of the object in accordance with set codes.

In an embodiment of the present disclosure, "the character points which are points having same information of position character in each of the projection images" is specified as: demodulating the projection images and comparing demodulated information on the projection images, if the demodulated information are the same, the points having the same demodulated information on the projection images are the character points.

In an embodiment of the present disclosure, the set codes are codes which are formed by changing the frequency of the infrared lights illuminating the object with time.

In an embodiment of the present disclosure, the depth of focus of the character points is calculated by means of a triangular positioning method.

BRIEF DESCRIPTION OF THE DRAWINGS

Other features, objects and advantages of the present disclosure will become more apparent by reading the following detailed description about non-limiting embodiments with reference to the accompanying drawings.

DETAILED DESCRIPTION OF EMBODIMENTS

Below, detailed description is made to the present disclosure in conjunction with the accompanying drawings and embodiments. It should be understood that specific embodiments described herein are only intended to interpret the present disclosure, rather than limiting the present disclosure. In addition, it should be noted that for sake of description, only those components related to the present disclosure are shown.

It should be noted that embodiments and features therein in the present disclosure may be combined with each other without conflict. The present disclosure will be described in detail below with reference to the accompanying drawings and in conjunction with the embodiments.

Figure 1:
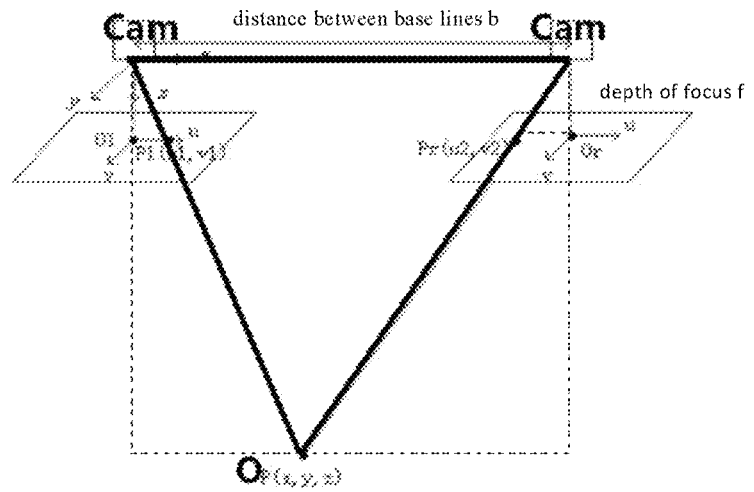
FIG. 1 is a schematic view of a spatial point positioning structure in the related art.

As shown in FIG. 1, the spatial positioning techniques in the related art are based on the stereoscopic photography technology of dual camera. One point O in space is respectively imaged as two points Pl and Pr in two images which are taken by two cameras respectively. Depth information of the point O is obtained by calculating positions of the two points in the two images.

However, such a technology has its own inherent defects, especially when searching for corresponding characterizing points in the two images (that is, searching for the point Pr corresponding to the point Pl). The algorithm is very difficult and the program load is extremely large. Further, it is extremely prone to error, and for an object without texture characters in the space, it is impossible to acquire information of a depth of focus.

Figure 2:
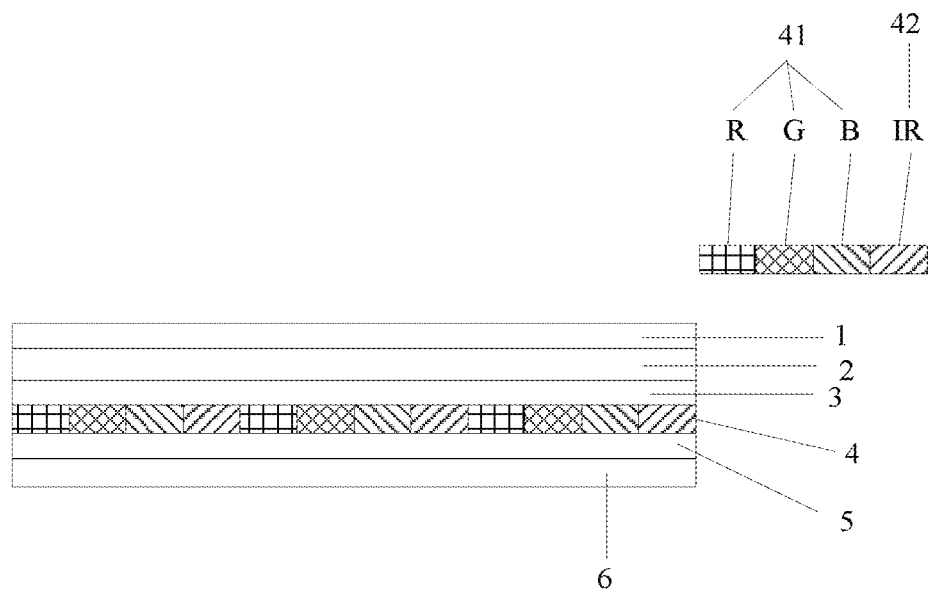
FIG. 2 is a schematic view of an OLED display structure in accordance with an embodiment of the present disclosure.
Figure 3:
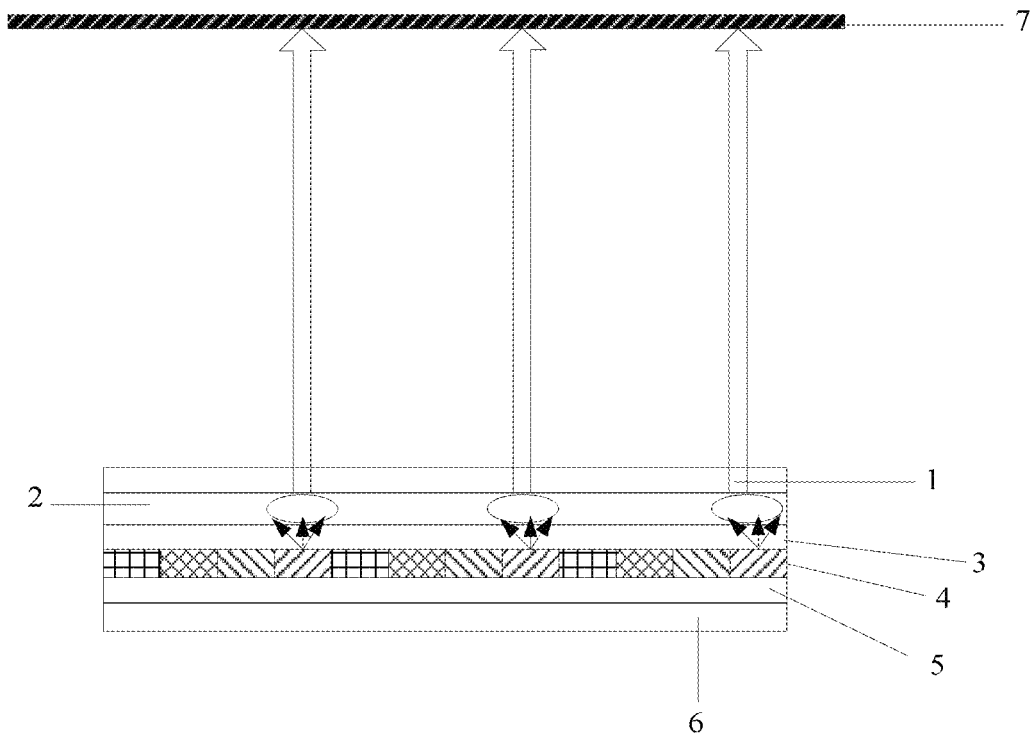
FIG. 3 is a schematic view of an OLED display structure illuminating a surface of an object, in accordance with an embodiment of the present disclosure.

With reference to FIGS. 2 and 3, an embodiment of the present disclosure provides an OLED display structure, including a light emitting layer 4. The light emitting layer 4 includes a plurality of pixels 41. Each of the pixels 41 includes a red sub-pixel R, a green sub-pixel G and a blue sub-pixel L. An infrared sub-pixel IR 42 is provided between two adjacent pixels 41.

In the OLED display structure of the present embodiment, the infrared sub-pixels are added into the light emitting layer. Various regions of the object are marked with lights emitted from the infrared sub-pixels, and each of the infrared sub-pixels emits light to the surface of the object to form a mark.

Further, the OLED display structure includes an upper substrate layer 1, a cathode layer 3, a light emitting layer 4, an array substrate 5 and a lower substrate layer 6 arranged in sequence. The pixels in the light emitting layer are regularly arranged in an array, and the infrared sub-pixels are provided between the adjacent pixels. Thus, the infrared sub-pixels 42 are also arranged uniformly in an array in the light emitting layer 4. It is necessary for the OLED display structure in the present embodiment to mark the surface 7 of the object which has a certain length and width. The infrared sub-pixels are arranged in an array so that they can cover a wider range when they are illuminating the surface of the object. The marks in an array and in a plane, as shown in FIG. 3, are formed when those infrared sub-pixels illuminate the surface of the object.

Further, the OLED display structure further includes a lens layer 2 arranged between the upper substrate layer 1 and the cathode layer 3.

Further, a lens structure is provided at a position of the lens layer corresponding to each of the infrared sub-pixels. In the present embodiment, a lens layer is added between the upper substrate layer and the cathode layer of the display structure, and the lens layer are provided with a lens structure right above each of the infrared sub-pixels. The infrared light to be emitted from the display structure are collimated by the lens layer, so that the infrared light illuminate the surface of the object in an outgoing direction perpendicular to the OLED display structure, and the marking to the surface of the object may become more accurate. Because there are no lens structures above other sub-pixels, other lights are emitted from the OLED display structure with a high transmissivity, which would not adversely affect the display of the screen. There are various options to the material for preparing the lens layer in the present disclosure. Liquid crystal materials or other polymer materials can all meet the above requirements.

An embodiment of the present disclosure also provides an OLED display device including the above OLED display structure. The display device including the above OLED display structure is capable of marking the surface of the object, and calculate the depth of focus of the points on the surface of the object in combination with other structures, which is relative convenience.

Figure 6:
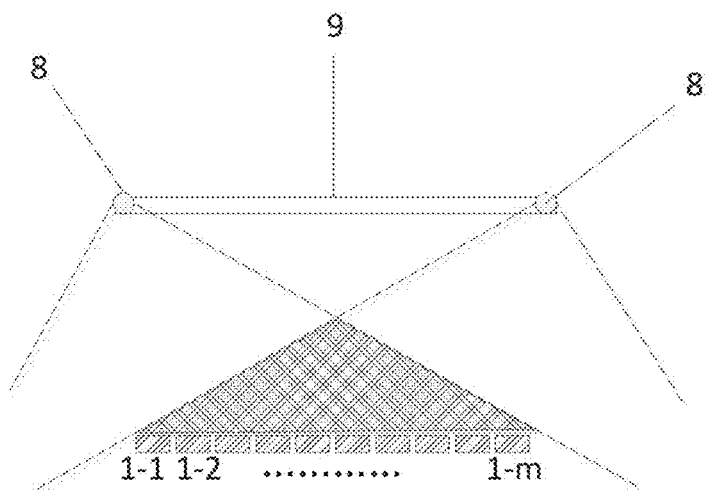
FIG. 6 is a schematic structural view of a spatial point positioning system based on an OLED display device in accordance with an embodiment of the present disclosure.

As shown in FIG. 6, an embodiment of the present disclosure further provides a spatial point positioning system based on the OLED display device. The spatial point positioning system includes the above OLED display device 9, at least two infrared cameras 8 on the OLED display device 9 and a processor.

The OLED display device is used to transmit information of position character to the surface of the object through the infrared sub-pixels.

Each of the infrared cameras are used to take photos of the surface of the object, so as to obtain projection images, and all of the projection images taken by respective infrared cameras include the information of the position character.

The processer is used to calculate the information of the depth of focus at the point in accordance with the character points which are points having same information of position character in each of the projection images.

In the positioning system provided by the present embodiment, the OLED display device illuminates the surface of the object, and the infrared sub-pixels in the OLED display device illuminate the surface of the object. The illumination light contains information of position character, and the infrared cameras take photographs of the surface of the object which is then processed by the processor to establish an accurate and efficient spatial positioning regime. The system of the present invention reduces the complexity of the algorithm and improves reliability and accuracy of the detection.

Further, the OLED display device is also used to mark the surface of the object with the infrared sub-pixels on the light emitting layer, and the number of the marking points is identical with that of the infrared sub-pixels. The infrared sub-pixels illuminate the surface of the object in accordance with set codes. As shown in FIG. 6, the present positioning system includes one OLED display device and at least two infrared cameras. As illustrated, two infrared cameras are placed on the display device, and the surface of the object is marked by the infrared sub-pixels on the light emitting layer of the display device. It is shown in FIG. 6 a row of marking points, 1-1, . . . 1-m. The infrared cameras take photographs of the surface of the object. A region marked by grids in FIG. 6 is a common range in which both infrared cameras can take photographs. In practice, a plurality of infrared cameras may be utilized to take photos as actually required, or the type of the infrared camera may be selected to obtain a wider range to take photos.

The definition "the character points are points having same information of position character in each of the projection images" is specified as: demodulating the projection images and comparing the demodulated information on the projection images.

If the demodulated information on the projection images are the same, the points having same demodulated information on the projection images are the character points. In order to determine the character points on the projection image taken by the infrared camera, it is necessary to demodulate the projection image taken by the infrared camera, and the points having same demodulated information on the projection images are the character points. In the present embodiment, the points on the projection image are demodulated in a form of codes, and the codes are compared to determine whether they are identical with each other.

Further, the set codes are frequency changes of the infrared light rays (IR light rays) illuminating the object with time. IR light illuminate the surface of the object at different frequencies, and the rule of the frequency changing with time is the set codes.

Figure 4:
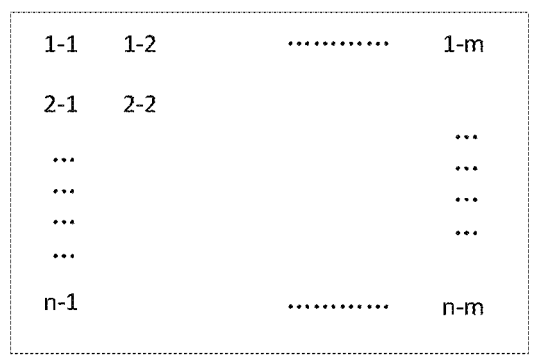
FIG. 4 is a plan view showing marks on an exit surface in FIG. 3.

An embodiment of the present disclosure provides an example. Firstly, the surface of the object is marked by the infrared sub-pixels, in which the number of the marking points is identical with that of the infrared sub-pixels. As shown in FIG. 4, for example, the infrared sub-pixels are arranged in an array of n rows and m columns, then the number of marking points of the surface of the object is n×m. After that, a frequency modulation coding method may be used to achieve the coding by modulating the frequency of the outgoing infrared lights. Such codes are information of position states (character) which are transmitted by the light emitting layer. The outgoing infrared lights illuminate the surface of the object with a frequency of the set code. When the infrared cameras take photos of the surface of the object, the taken projection images are decoded. The different projection images are compared with each other after being decoded. If two codes are identical, it indicates that the points having the same code are the character points. After the character points are found out, data on the depth of focus may be calculated.

Figure 5:
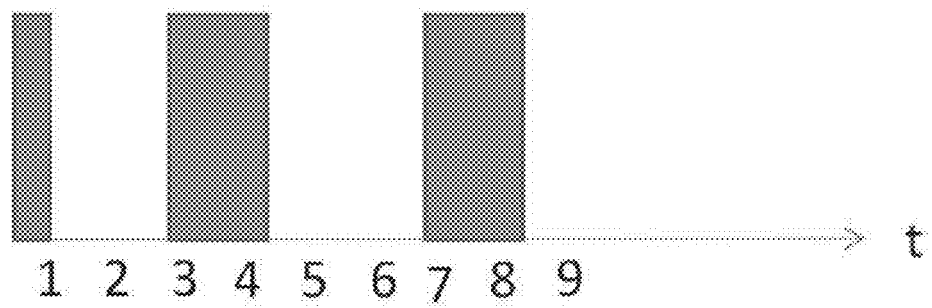
FIG. 5 is a schematic view of a transmitted code in an embodiment of the present disclosure.

As shown in FIG. 5, the embodiment of the present disclosure provides a method of transmitting and decoding 9 digit codes. The infrared sub-pixels illuminate the surface of the object in accordance with the codes shown in FIG. 5. The infrared sub-pixels emit infrared light with a frequency of F1 at time 1, 3, 4, 7, 8, and emit infrared light with a frequency of 0 at time 2, 5, 6, 9. In this way, the code thereof is set to be 101100110. The infrared lights are emitted on the surface of the object so as to light up the surface of the object. The imaging projection of the surface of the object is obtained by taking photos of the surface of the object by the infrared camera. The projection image is demodulated, and the demodulating code is 101100110. In the pictures taken by the infrared camera, all the points with the code 101100110 are the character points which need to be calculated. Once such character points are found out, the data on the depth of focus of the points can be calculated. It is provided by the present embodiment a method of coding and decoding a 9 digit code, which enable coding to 29 points. In practical requirements, marking and coding to more points are achieved by providing a plurality of infrared sub-pixel points, so as to achieve the determination of the character points on a larger surface of an object. Such a system is accurate and high-efficient. Further, the depth of focus of the points on the surface of the object is calculated with the above method. Complexity degree of algorithm is reduced and the algorithm has a relatively high reliability and accuracy.

Further, the data on the depth of focus of the character points are calculated with a triangular positioning method.

The spatial point positioning system based on the OLED display device and provided by the embodiment of the present disclosure marks the surface of the object using the infrared sub-pixels in the OLED display device, then codes the light emitted from the infrared sub-pixels and demodulates the projection images taken by the infrared camera, thereby achieving the positioning to the character points on the surface. The method is simple, using an algorithm with low complexity degree and the detection has a relatively high reliability.

Figure 7:
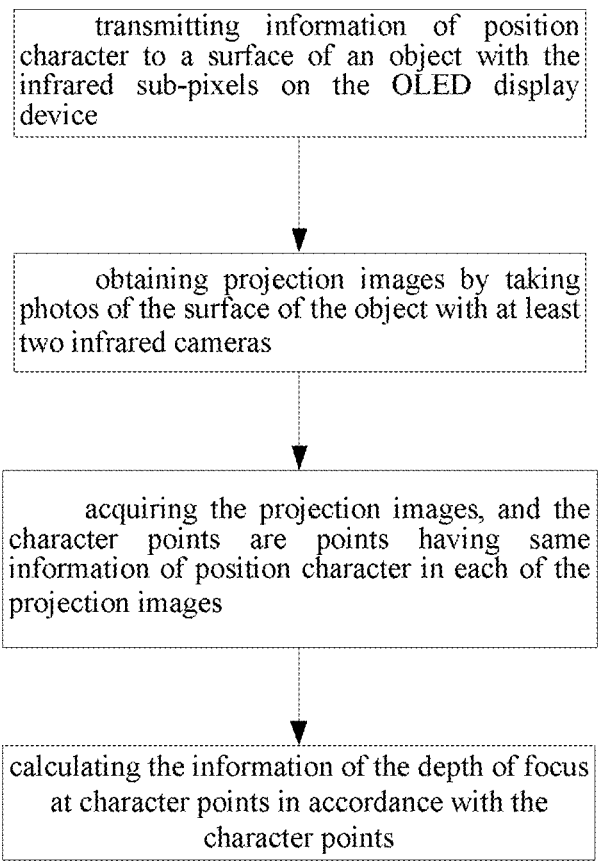
FIG. 7 is a flow chart of a method for positioning a spatial point based on an OLED display device in accordance with an embodiment of the present disclosure.

As shown in FIG. 7, an embodiment of the present disclosure also provides a method for positioning a spatial point based on the OLED display device, including the following steps: transmitting the information of position character to the surface of the object with the infrared sub-pixels on the OLED display device; obtaining projection images by taking photos of the surface of the object with at least two infrared cameras, wherein the projection image taken by each of the infrared cameras comprises the information of the position character; acquiring the projection images and calculating the information of the depth of focus at character points in accordance with the character points, wherein the character points are points having same information of position character in each of the projection images.

In the positioning method provided by the present embodiment, the surface of the object is illuminated by the OLED display device, and the lights emitted from the infrared sub-pixels mark the surface of the object, photographs of the surface of the object is taken by the infrared cameras, and these photographs are processed by the processor thereby establishing an accurate and efficient spatial positioning regime. The system of the present invention reduces the complexity of the algorithm and improves reliability and accuracy of the detection.

Further, "transmitting information of position character to a surface of an object with the infrared sub-pixels on the OLED display device" comprises: marking the surface of the object in accordance with the infrared sub-pixels on the light emitting layer, the number of marking points being identical with the number of the infrared sub-pixels, the infrared sub-pixels illuminate the surface of the object in accordance with set codes.

Further, the definition "the character points which are points having same information of position character in each of the projection images" is specified as: demodulating the projection images and comparing the demodulated information on the projection images, if the demodulated information are the same, the points having same demodulated information on the projection images are the character points.

Firstly, the surface of the object is marked by the infrared sub-pixels, in which the number of the marking points is identical with that of the infrared sub-pixels. As shown in FIG. 4, for example, the infrared sub-pixels are arranged in an array of n rows and m columns, then the number of marking points of the surface of the object is n×m. After that, a frequency modulation coding method may be used to achieve the coding by modulating the frequency of the outgoing infrared lights. Such codes are information of position states (character) which are transmitted by the light emitting layer. The outgoing infrared lights illuminate the surface of the object with a frequency of the set code. When the two infrared cameras take photos of the surface of the object, the taken projection images are decoded. The different projection images are compared with each other after being decoded. If two codes are identical, it indicates that the points having the same code are the character points. After the character points are found out, data on the depth of focus may be calculated.

Further, the set codes are codes which are formed by changing the frequency of the infrared lights illuminating the object with time. The infrared lights illuminate the surface of the object at different frequencies, and the changing rule of the frequency with time is the set codes.

Further, the depth of focus of the character points is calculated by means of a triangular positioning method. With reference to the example of the positioning system, the positioning method provided by the present embodiment is simple, using an algorithm with low complexity degree and the detection has a relatively high reliability.

In accordance with the technical solutions provided by the embodiments of the present disclosure, the infrared sub-pixels are added into the light emitting layer. Various regions of the object are marked with lights emitted from the infrared sub-pixels; the spatial points are positioned with the display device made of the above display structure, thereby enabling to establish an accurate and efficient spatial positioning regime, reducing the complexity degree of algorithm, and improving the reliability and accuracy of the detection.

The above description is only explanation about the optional embodiments of the present disclosure and the principle of the applied technique. The skilled person in the art shall understand that the scope of the present disclosure is not limited to the technical solutions combined specifically by the above technical features, while it shall also cover other technical solutions formed by any combination of the above technical features or their equivalent features. For example, the technical solutions can be formed by interchanging the above features and the technical features having the similar function (but not limiting to them) in the disclosure of the present disclosure.

What is claimed is:

1. A spatial point positioning system based on an OLED display device, comprising:
   the OLED display device for transmitting information of position character to a surface of an object with infrared sub-pixels, wherein the OLED display device comprises an OLED display structure having a light emitting layer, and the light emitting layer comprises a plurality of pixels and infrared sub-pixels arranged between adjacent pixels;
   at least two infrared cameras, each of which is configured to capture images of the surface of the object, so as to obtain projection images comprising the information of position character; and
   a processor for calculating information of a depth of focus at character points in accordance with the character points which are points having same information of position character in each of the projection images,
   wherein the OLED display device is configured to mark the surface of the object in accordance with the infrared sub-pixels on the light emitting layer, a number of marking points is identical with the number of the infrared sub-pixels, and the infrared sub-pixels illuminate the surface of the object in accordance with set codes.

2. The spatial point positioning system based on the OLED display device of claim 1, wherein the character points which are points having same information of position character in each of the projection images is specified as:
   demodulating the projection images and comparing demodulated information on the projection images,
   if the demodulated information on the projection images are the same, the points having the same demodulated information on the projection images are the character points.

3. The spatial point positioning system based on the OLED display device of claim 1, wherein
   the set codes are codes which are formed by changing the frequency of the infrared lights illuminating the object with time.

4. The spatial point positioning system based on the OLED display device of claim 1, wherein
   the depth of focus of the character points are calculated by means of a triangular positioning method.

5. The spatial point positioning system based on the OLED display device of claim 1, wherein
   the at least two infrared cameras are provided on the OLED display device.

6. The spatial point positioning system based on the OLED display device of claim 1, wherein the OLED display structure further comprises an upper substrate layer, a cathode layer, the light emitting layer, an array substrate and a lower substrate layer arranged in sequence.

7. The spatial point positioning system based on the OLED display device of claim 1, wherein the OLED display structure further comprises a lens layer between the upper substrate layer and the cathode layer.

8. The spatial point positioning system based on the OLED display device of claim 1, wherein a lens structure is provided at a position in the lens layer corresponding to each of the infrared sub-pixels.

9. The spatial point positioning system based on the OLED display device of claim 1, wherein each of the pixels comprises a red sub-pixel, a green sub-pixel and a blue sub-pixel.

10. A method for positioning a spatial point based on the OLED display device, wherein the OLED display device comprises an OLED display structure having a light emitting layer, and the light emitting layer comprises a plurality of pixels and infrared sub-pixels arranged between adjacent pixels, the method including the following steps:

transmitting information of position character to a surface of an object with the infrared sub-pixels on the OLED display device;

obtaining projection images by taking photos of the surface of the object with at least two infrared cameras, wherein the projection image taken by each of the infrared cameras comprises the information of the position character; and acquiring the projection images and calculating information of a depth of focus at character points in accordance with the character points, wherein the character points are points having same information of position character in each of the projection images.

11. The method of claim 10, wherein
transmitting information of position character to a surface of an object with the infrared sub-pixels on the OLED display device comprises: marking the surface of the object in accordance with the infrared sub-pixels on the light emitting layer, the number of marking points being identical with the number of the infrared sub-pixels, the infrared sub-pixels illuminate the surface of the object in accordance with set codes.

12. The method of claim 10, wherein
the character points which are points having same information of position character in each of the projection images is specified as:

demodulating the projection images and comparing demodulated information on the projection images, if the demodulated information are the same, the points having the same demodulated information on the projection images are the character points.

13. The method of claim 11, wherein
the set codes are codes which are formed by changing the frequency of the infrared lights illuminating the object with time.

14. The method of claim 10, wherein
the depth of focus of the character points is calculated by means of a triangular positioning method.

* * * * *